United States Patent
Jain et al.

(10) Patent No.: US 7,404,126 B2
(45) Date of Patent: Jul. 22, 2008

(54) SCAN TESTS TOLERANT TO INDETERMINATE STATES WHEN EMPLOYING SIGNATURE ANALYSIS TO ANALYZE TEST OUTPUTS

(75) Inventors: Sandeep Jain, Rewari (IN); Jais Abraham, Malapurram (IN)

(73) Assignee: Texas Instruments Incorporated, Dallas, TX (US)

( * ) Notice: Subject to any disclaimer, the term of this patent is extended or adjusted under 35 U.S.C. 154(b) by 138 days.

(21) Appl. No.: 11/308,481

(22) Filed: Mar. 29, 2006

(65) Prior Publication Data

US 2007/0234150 A1    Oct. 4, 2007

(51) Int. Cl.
   *G01R 31/28*    (2006.01)
(52) U.S. Cl. .................. 714/726; 714/732; 714/738
(58) Field of Classification Search .............. 714/727, 714/728, 729, 726, 732, 738
   See application file for complete search history.

(56) References Cited

U.S. PATENT DOCUMENTS 5,528,610 A * 6/1996 Edler et al. ................ 714/727
7,131,046 B2 * 10/2006 Volkerink et al. ........... 714/732
7,197,681 B2 * 3/2007 Dervisoglu et al. ......... 714/726
7,266,746 B2 * 9/2007 Hiraide ....................... 714/738

OTHER PUBLICATIONS

Subhasish Mitra, Michael Mitzenmacher, Steven S. Lumetta and Nishant Patil, "X-Tolerant Test Response Compaction" from IEEE CS and the IEEE CASS, IEEE Design & Test of Computers, Nov.-Dec. 2005.

* cited by examiner

*Primary Examiner*—David Ton
(74) *Attorney, Agent, or Firm*—Wade J. Brady, III; Frederick J. Telecky, Jr.

(57) ABSTRACT

Scan tests tolerant to indeterminate states generated in an integrated circuit (IC) when employing signature analysis to analyze test outputs. Bits with indeterminate-state are masked when scanning out the bits from the scan chains to force such indeterminate bits to a known logic level. This prevents a signature generator receiving the outputs of a scan test from generating an invalid signature. In an embodiment, masking information is stored in encoded form in a memory. A decoding circuit decodes the masking information and provides mask data under control from a mask controller. Mask data is sent to a masking circuit which also receives corresponding bits from scan-out vectors, with each scan-out vector being generated by a corresponding one of multiple scan chains. The output of the masking circuit may be provided in a compressed form to the signature generator circuit.

17 Claims, 5 Drawing Sheets

SCAN TESTS TOLERANT TO INDETERMINATE STATES WHEN EMPLOYING SIGNATURE ANALYSIS TO ANALYZE TEST OUTPUTS

BACKGROUND

1. Field of the Invention

The present invention relates generally to integrated circuits (IC) and more specifically to a method and apparatus for providing tolerance to indeterminate states that may occur at the scan outputs during scan tests of circuits.

2. Related Art

Test apparatus to run diagnostic and or/functional tests are frequently used to test electronic circuits (including circuit boards, etc.). In a common scenario, electronic circuits in integrated form (integrated circuits or ICs) may be subjected to various tests after fabrication to verify compliance with stated functionality and specifications. Thus, integrated circuits containing digital circuitry may be tested by inputting a sequence (or sequences) of digital bit patterns (test vectors) to various digital elements within the IC, and observing (and analyzing) the corresponding outputs.

Scan test techniques are often used to test ICs. When an IC is operated in a test mode, various sequential elements (such as flip-flops) in the IC are connected in a sequence (i.e., the output of one element is connected as an input to the next element) referred to as a "scan chain". Many of such scan chains may be present and operated in parallel in the IC being tested.

In a typical scan test scenario, a number of bits in a particular pattern of zeros and ones ("scan vector") are sequentially (one bit at every clock cycle) loaded (scanned-in) into a scan chain through the first element of the scan chain. Once the scan chains are loaded with the corresponding scan in vector, the functional circuit portions (generally the combinatorial logic) of the IC are evaluated based on the scanned-in bits. The flip-flops (contained in the scan cell) are designed to latch the results of the evaluation, and the bits latched in the scan chains are sequentially scanned out (scan-out) (one bit at every clock cycle) through the last scan cell in each of the scan chains.

In a combinational scan technique, only a single evaluation is performed in the evaluation phase, whereas in a sequential scan technique multiple evaluations may be performed in successive clock cycles (of a test cycle), before starting the scan out operation. The scan-in and scan-out operations are generally referred to as scan operations. In a sequential scan test (where sequential logic is tested) scan chains are generally subjected to one or more test cycles, with one test cycle being determined by one complete scan through the chain.

Signature analysis is often employed to analyze test outputs, particularly when a large number of scan chains are present in a circuit. In an example scenario, the scan chain outputs are compressed and provided to a signature generator (for example, a Multiple Input Signature Register (MISR)). The signature generator generates a test signature representative of the scan chain outputs collected over several test cycles, and provides the same to an external equipment (tester) which analyzes the signature to detect faults. By using such signature analysis techniques, a smaller amount of data can be conveniently examined to determine the presence of defects.

One problem with testing of digital logic in such environments is that some of the outputs may be in an indeterminate (unknown) state. Such indeterminate states may occur, for example, due to one or more uninitialized logic elements in the circuit (IC) that is being tested, or due to timing effects that may occur due to high speed testing.

Such indeterminate states (also called X states) may cause a signature generator (such as an MISR) to enter into an invalid state, consequently rendering the scan chain signature meaningless. One prior testing approach addresses such a problem (of indeterminate states) by not using a signature generator in the test path. However, such an approach denies the various benefits of signature analysis and may not be desirable in several environments.

Accordingly, what is needed is a method and apparatus that is tolerant to indeterminate states that may occur during circuit testing, while meeting one or more of the requirements noted above.

BRIEF DESCRIPTION OF THE DRAWINGS

The present invention will be described with reference to the following accompanying drawings, which are described briefly below.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

According to an aspect of the present invention, an on-chip test controller contains logic circuitry that masks (force to known state) potential indeterminate test output states and prevents the same from propagating to a signature generator circuit. As a result, test data outputs may still be validly represented by a signature code (generated by a signature generator circuit), which may then generate a corresponding signature of test outputs obtained over several test cycles and from multiple scan chains. Thus, the volume of test data outputs to be analyzed is maintained at manageable levels, while still being tolerant to indeterminate states.

According to another aspect of the present invention, a controller circuit specifies the specific inputs to the signature generator circuit, which need to be masked in each corresponding cycle. In an embodiment, a memory stores data representing various combinations of masks, and state machine specifies which of the stored masks need to be applied in each scan out cycle. A masking circuit may force the specified bit positions to a pre-determined value (e.g., 0) and the masks may be loaded into the memory from a tester which is designed to provide inputs and examine outputs of the signature generator circuit.

Another aspect of the present invention provides a convention using which the mask data can be stored in a compact form. According to that convention, the inputs to the signature generator circuit are viewed as multiple groups of bits. Each word of the memory is divided into two portions, with each bit in one portion specifying whether the bits in the corresponding group need to be masked and each bit in the other portion specifying which specific positions in selected groups have to be masked. As a result, more positions may be masked than necessitated by the indeterminate states, but can be an acceptable compromise in memory constrained environments.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well known structures or operations are not shown in detail to avoid obscuring the features of the invention.

The features of the invention may be appreciated in comparison with the details of a prior embodiment. Accordingly, the details of such a prior embodiment are described first below.

2. Prior Embodiment

Figure 1:
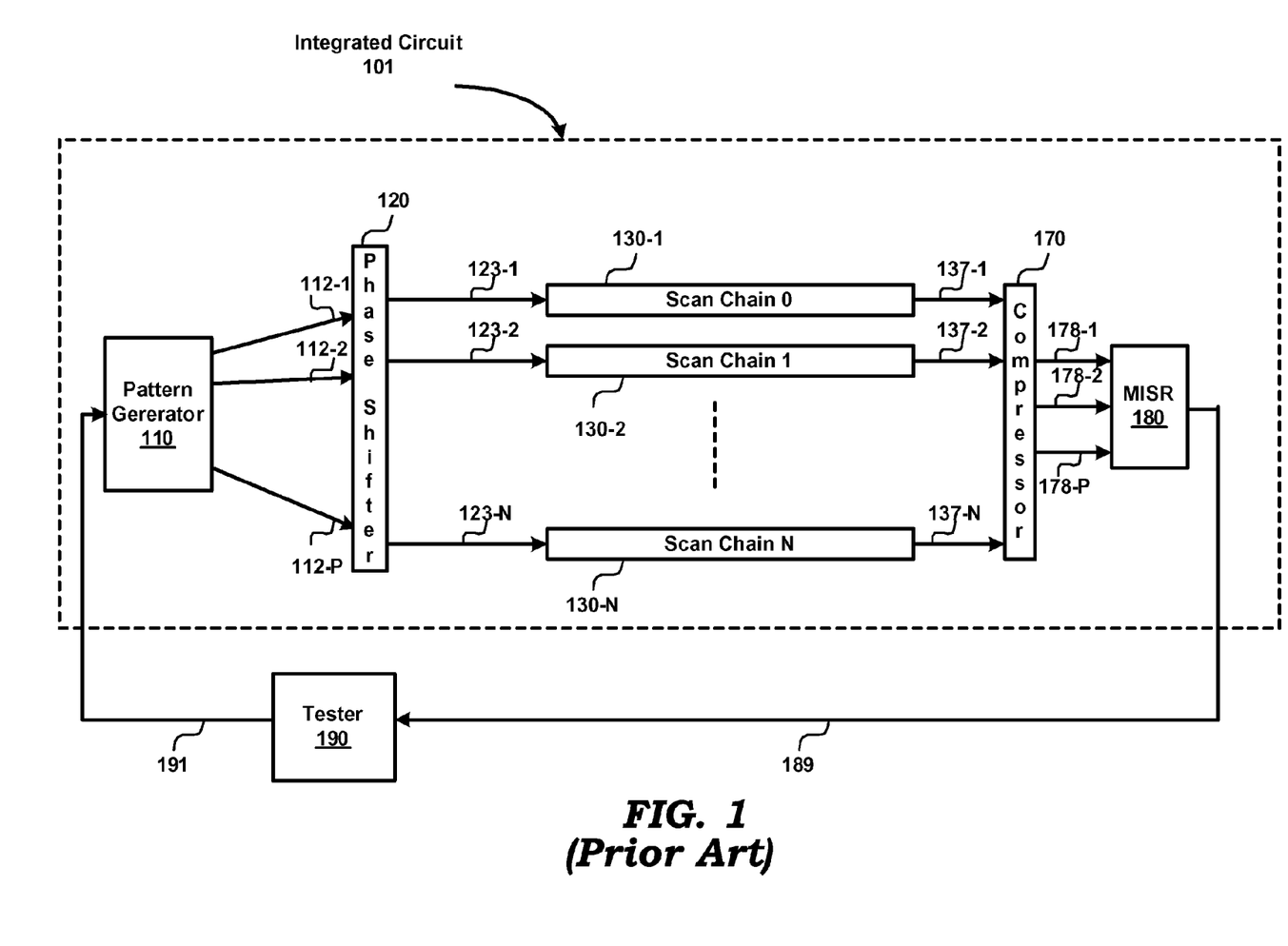
FIG. 1 is a diagram of an example environment in one prior embodiment showing a test environment in which scan techniques are employed

FIG. 1 is a diagram of an example environment in one prior embodiment. The diagram shows a test environment in which scan techniques are employed to test integrated circuit 101 (example of a electrical circuit) using tester 190. Integrated circuit 101 is shown containing pattern generator 110, phase shifter 120, scan chains 130, compressor 170, and Multiple Input Signature Register (MISR) 180. Each block is described below in further detail.

Tester 190 provides data (seeds) on path 191, which are used by the combination of pattern generator 110 and phase shifter to generate scan-in vectors for respective scan chains 130-1 through 130-N as described below in further detail. Tester 190 receives the outputs of tests (in the form of test signatures) on path 189, and analyzes the signatures by comparing them with expected results to determine if there are faulty elements in the scan chains. Pattern generator 110 generates test vectors (one each for each path 112-1 through 112-P) which are shifted one bit at a time every clock cycle and forwarded on paths 112-1 through 112-P. Pattern generator 110 may use linear feedback shift registers (LFSR) to generate pre-determined sequences as test vectors based on the seed value (an initial state specified by the input from tester 190) received on path 191.

Phase shifter 120 receives test vectors on paths 112-1 to 112-P, and performs logic operations (for example, AND, XOR, etc) on bits received on paths 112-1 through 112-P to generate an expanded set of intermediate vectors on paths 123-1 through 123-N which are forwarded to corresponding scan chains 130-1 through 130-N. The number N is greater than P. Thus, phase shifter 120 operates to reduce the volume of test data that needs to be provided by tester 190.

In generating the expanded set of intermediate vectors 123-1 through 123-N, phase shifter 120 provides phase shifts between the intermediate vectors on paths 123-1 through 123-N generated for each scan chain. Without such phase shifting, the pseudo-random sequences generated from adjacent cells (not shown) in pattern generator 110 are shifted in phase by only a single clock cycle, and thus may be very much correlated. Phase shifter 120 thus, produces greater randomness between individual scan-in vectors.

The output of phase shifter 120 in each scan/clock cycle may be viewed as an input vector, with each bit of the vector being provided for scan-in to the corresponding scan-chain, i.e the bits on paths 123-1 through 123-N may be viewed as constituting an input vector for ease of description.

Each of scan chains 130 (chains 130-1 through 130-N) may contain corresponding sequential/memory elements (such as flip-flops) connected in a sequence (i.e., the output of one element is connected as an input to the next element). Each of scan chains 130-1 through 130-N receives in each clock cycle one bit of a scan-in vector serially on paths 123-1 through 123-N, and provides one bit of a scan-out vector (containing the output/response of individual elements in the scan chains) serially on paths 137-1 through 137-N.

In the diagram shown, scan-in (test) vectors are shifted successively through the elements in the scan chains one bit every clock cycle. Test vectors are scanned-in (shifted by one bit) typically at the start of a clock cycle, the elements in the scan chain are put in evaluation mode, and the output (typically, a single bit) of each element in the scan chain is latched at the end of every clock cycle. Thus, at the end of the evaluation mode, each scan chain would store the results of evaluation, and the stored values may be termed as a scan-out vector.

Compressor 170 receives an output vector containing one bit of each scan chain (i.e., one bit from each scan-out vector) on paths 137-1 through 137-N, and performs logic operations (for example, AND, XOR, etc) on bits to generate scan-out vectors in compressed form. Each scan out vector in compressed form is provided to MISR 180 on paths 178-1 through 178-Q. Thus, the number of individual paths on 178 is smaller than the that in 137, and may be equal to P.

MISR 180 generates a signature representative of the scan-out vectors received on paths 178-1 through 178-Q, and provides the signature to tester 190 on path 189. MISR 180 may be implemented as a finite state machine (for example, an LFSR). Although not shown, each of pattern generator 110, scan chains 130-1 through 130-N and MISR 180 is clocked by a same clock signal.

Analysis of the signature received from MISR 180 by tester 190 may reveal faulty elements in scan chains 130-1 through 130-N. The analysis generally needs to be consistent with the patterns scanned in, and may be performed in a known way.

One source of inaccuracy of the results of analysis of testing is that some of the bits generated by the combinational logic and provided as scanned out bits may be in an indeterminate state. For example, scan chains 130-1 to 130-N may receive data from uninitialized logic elements (for example, uninitialized flip-flops). As a result, some bits in the scan-out vectors generated and forwarded eventually to MISR 180 may be in an indeterminate state. Indeterminate-state outputs may also be caused due to timing issues during high-speed testing. Indeterminate values in a scan-out vector may cause MISR 190 to progress to invalid states, thus often rendering the generated signature meaningless or difficult to analyze for determining faults in scan chains 130-1 through 130-N.

The present invention addresses this problem by masking any indeterminate logic outputs generated by elements in scan chains 130-1 through 130-N, as described below.

3. Masking Indeterminate Bits in a Scan-Out Vector

Figure 2:
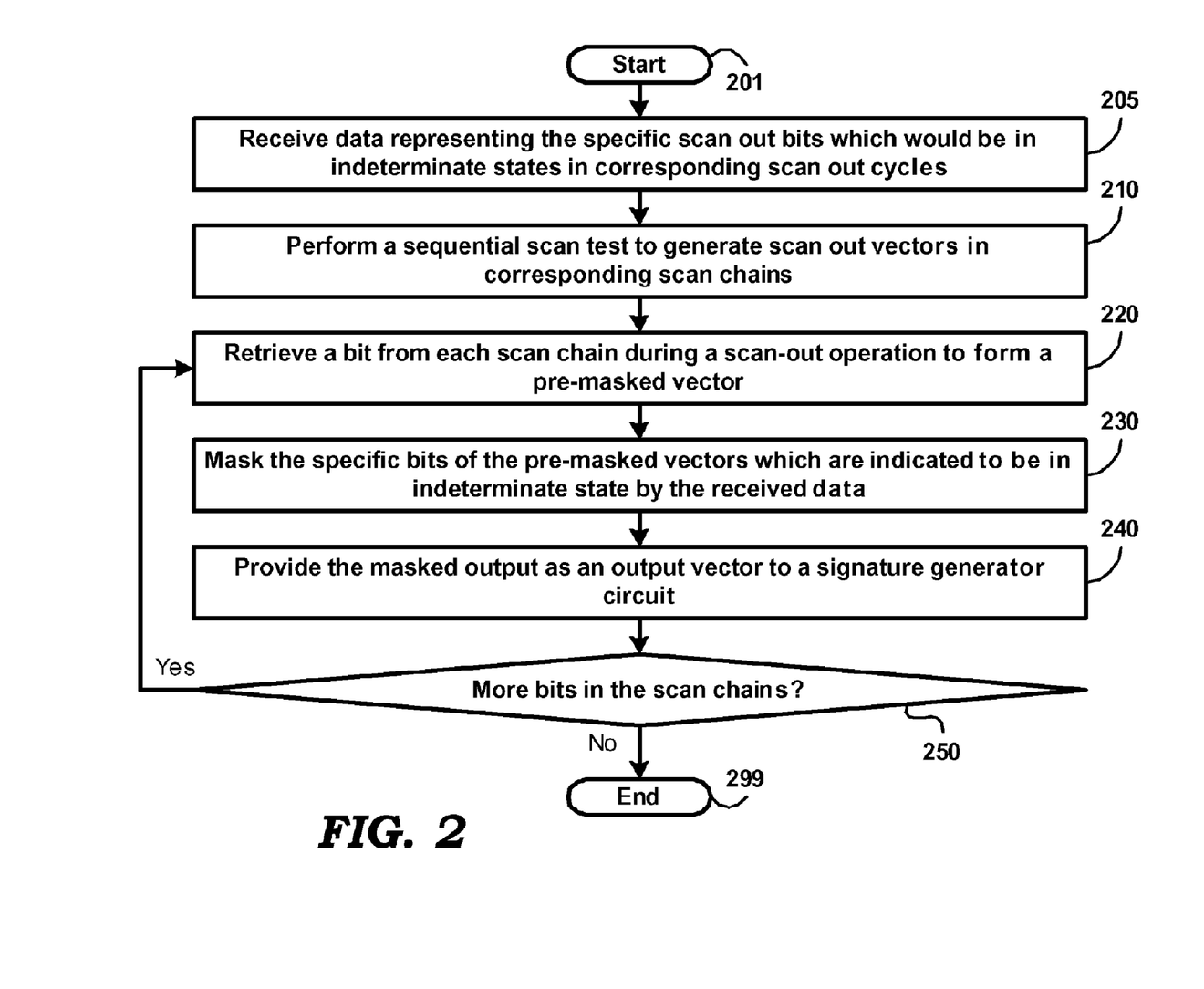
FIG. 2 is a flow chart illustrating the manner in which indeterminate bits in a scan-out vector are masked during a scan test, according to an aspect of the present invention.

FIG. 2 is a flow chart illustrating the manner in which indeterminate bits in a scan-out vector are masked during a scan test, according to an aspect of the present invention. As described in sections below, the flow chart may be implemented to modify the embodiment of FIG. 1 described above.

However, the flow chart may be implemented in other environments as well. The flow chart starts in step 201, where control immediately goes to step 205.

In step 205, data representing the specific bits to be masked (mask data) in a scan-out vector during a corresponding clock (scan-out) cycle is received. Such data may be obtained in a known way (for example, from a computer simulation of the circuit containing the scan chains or can be determined by a designer by examining the circuit configuration/delays, etc.). Control passes to step 210.

In step 210, a scan test is performed on the circuit to be tested, thereby generating scan-out vectors from corresponding scan chains in the circuit to be tested. Thus, at the end of the test, each scan chain stores a corresponding scan vector (containing a sequence of bits). Some of these bits generated may be in a state that is indeterminate as described above. Control passes to step 220.

In step 220, a bit is received from each scan chain during a scan out operation. Typically, such bits are received at the end of a corresponding clock cycle, and the received bits are together conveniently termed as a pre-masked vector (to mean not yet masked vector, since a masking operation potentially follows, as described in steps below). Control passes to step 230.

In step 230, the specific bits of the pre_masked vectors, which are indicated to be in indeterminate state by the received data, are masked. This is briefly illustrated with an example.

Assuming there are eight scan chains in a circuit that is being tested using a scan test, eight bits are received at the end of each scan-out cycle. For example, a vector 10000100 may be received at a scan-out cycle "i", with each bit in the vector having been received from a corresponding scan chain (conveniently numbered 0 to 7 in this example) in the set of the eight scan chains.

Computer simulation of the circuit (contained in the eight scan chains) may reveal that at scan-out cycle "i", the output of scan chain 3 would be in an indeterminate state. Thus, the logic 1 received in bit position 2 may not be a valid response bit.

Mask data received may indicate this by providing a mask value 11111011, where the logic 0 in bit position 3 indicates that bit 3 of the received vector is to be masked (force to a known state). Thus, bit 3 may be forced to a logic 0 (or any pre-specified value), for example by an AND operation, while other bits in the received vector deemed to be in valid states are not altered. Control passes to step 240.

In step 240, the masked vector is provided as an output vector to a signature analyzer. With respect to the example given in step 230, an output vector with value 10000000 (with the logic 1 in bit position 3 having been masked to provide a logic 0) is forwarded to a signature analyzer. Thus, indeterminate values are replaced by pre-determined values before being forwarded to a signature analyzer. The signature analyzer may thus be prevented from progressing through invalid states and from corrupting the test signature. Control passes to step 250.

In step 250, it is checked to see whether there are more bits being shifted out from the scan chains, i.e, whether the test cycle is complete or not. If yes, control passes to step 220, where steps 220-250 are repeated for a new vector (and a corresponding new mask data) received. If there are no more bits being shifted out of the scan chains (which could signal the end of a test cycle, for example), control passes to step 299 where the flow chart ends.

Thus, it may be seen from the flow chart of FIG. 2, that indeterminate bits generated during a scan test are masked and effectively prevented from corrupting a test signature generated in a signature generator. The steps described above may be implemented in circuit form. Accordingly, the description is continued with respect to an example implementation modifying the implementation of FIG. 1.

4. Implementation

Figure 3:
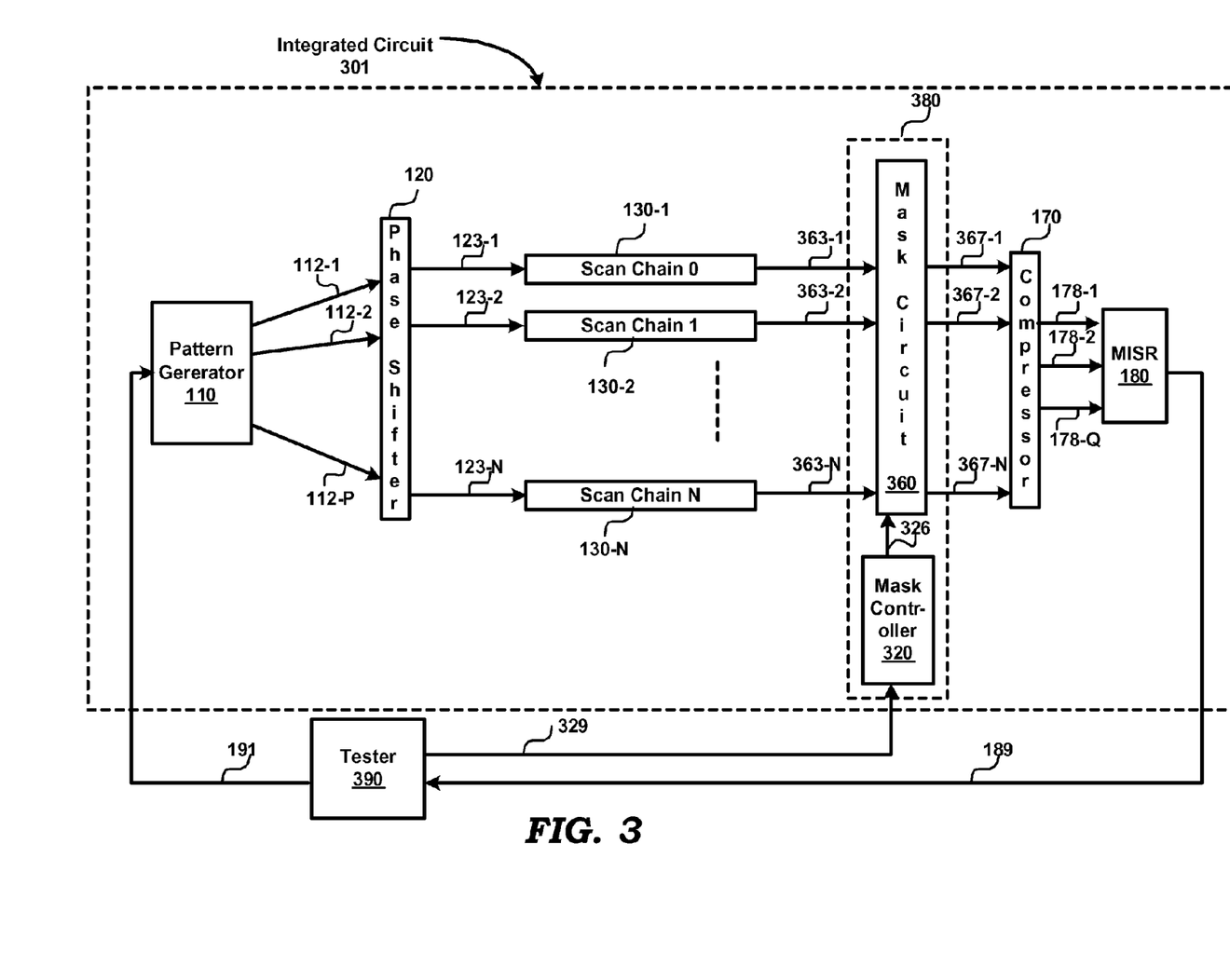
FIG. 3 is a block diagram showing the implementation in an example environment of the masking feature described in the flow chart of FIG. 2.

FIG. 3 is a block diagram showing the implementation of the masking feature described in the flow chart above in an example environment in which scan tests are performed on an example integrated circuit 301. The block diagram is shown containing pattern generator 110, phase shifter 120, scan chains 130, masking logic 380, compressor 170, MISR 180 and tester 390. Each component is described below in further detail.

Tester 390 may generate seed data similar to tester 190 and is thus shown sending the seed data on path 191. In addition, tester 390 may configure mask controller 320 (contained in masking logic 380) to indicate the specific bits that would be in indeterminate states in each scan out cycle (by sending appropriate data on path 329).

Pattern generator 110, phase shifter 120, scan chains 130, compressor 170, and MISR 180 operate in a fashion similar to the description provided above, and their operation is not repeated here for conciseness.

Masking logic 380 contains mask circuit 360 and mask controller 320 in one embodiment. These are described below in detail.

Mask controller 320 receives masking information from tester 390 on path 329 specifying which bit(s) of scan-out vectors should be masked. Since a test cycle may contain multiple clock cycles, mask controller 320 may receive data representing masking information for a complete test cycle. Alternatively, mask controller 320 may receive data representing mask data for two or more test cycles (consistent with the design of tester 390).

Thus, assuming there are N-scan chains and that the length of the longest scan chain (in scan chains 130-1 through 130-N) is z bits long, mask controller 320 may receive data representing z N-bit wide words, with each word containing mask bit(s) for a corresponding bit(s) to be masked in a pre-masked vector during a corresponding test cycle.

Mask controller 320 generates mask data (based on the masking information received from tester 390) for each clock cycle and forwards the generated mask data to mask circuit 360 on path 326. With respect to FIG. 3, assuming that the pre-masked vector (meaning a vector which has not yet been masked) received on paths 363-1 through 363-N contains N bits (one bit each from each scan-out vector on paths 363-1 through 363-N), mask controller 360 provides an N-bit mask data in every clock cycle to mask circuit 360 on path 326 which is thus N-bits wide.

Mask circuit 360 masks specific bits (as specified by the mask data received from mask controller 320 on path 326) of the pre-masked vector received on paths 363-1 through 363-N, and provides a masked output vector, with each bit of the output vector being provided on corresponding paths 367-1 through 367-N, to compressor 170.

Mask circuit 360 may contain gating logic for masking each bit of a received pre-masked vector. With reference to FIG. 3, mask circuit 360 may contain N gating elements which may be, for example, two-input AND gates. One input of each AND gate may be provided from a corresponding bit (363-1 to 363-N) in the received pre-masked vector, while the second input may be provided from a corresponding bit of the mask data received from mask controller 320 on path 326.

Thus, mask circuit 360 receives a pre-masked vector on paths 363-1 through 363-N, and provides on path 367-1 through 367-N a corresponding output vector masked at bit positions having indeterminate values.

Mask data received from mask controller 320 may use logic 0 to mask (force to a known state) an indeterminate bit-value at a corresponding position in a received pre-masked vector. Other bits in the mask data would be a logic 1 in such a case. The reverse is also possible if suitable gating logic (other than AND gates) is used in mask circuit 360.

Thus, indeterminate bit values in scan-out vectors obtained from scan chains 130-1 through 130-N are masked (forced to a known state) state before forwarding the generated output vectors (on paths 367-1 through 367-N) to a signature generator (MISR 180 of FIG. 3). A signature generator (such as MISR 180) may thus operate consistently to provide a valid signature of the scan chains' response to test vectors.

Masking logic 380 may contain various sub-blocks within it to implement the features described above. Accordingly, the description is continued with respect to an example realization of mask controller 320 at a block level in one embodiment.

5. Masking Logic

Figure 4:
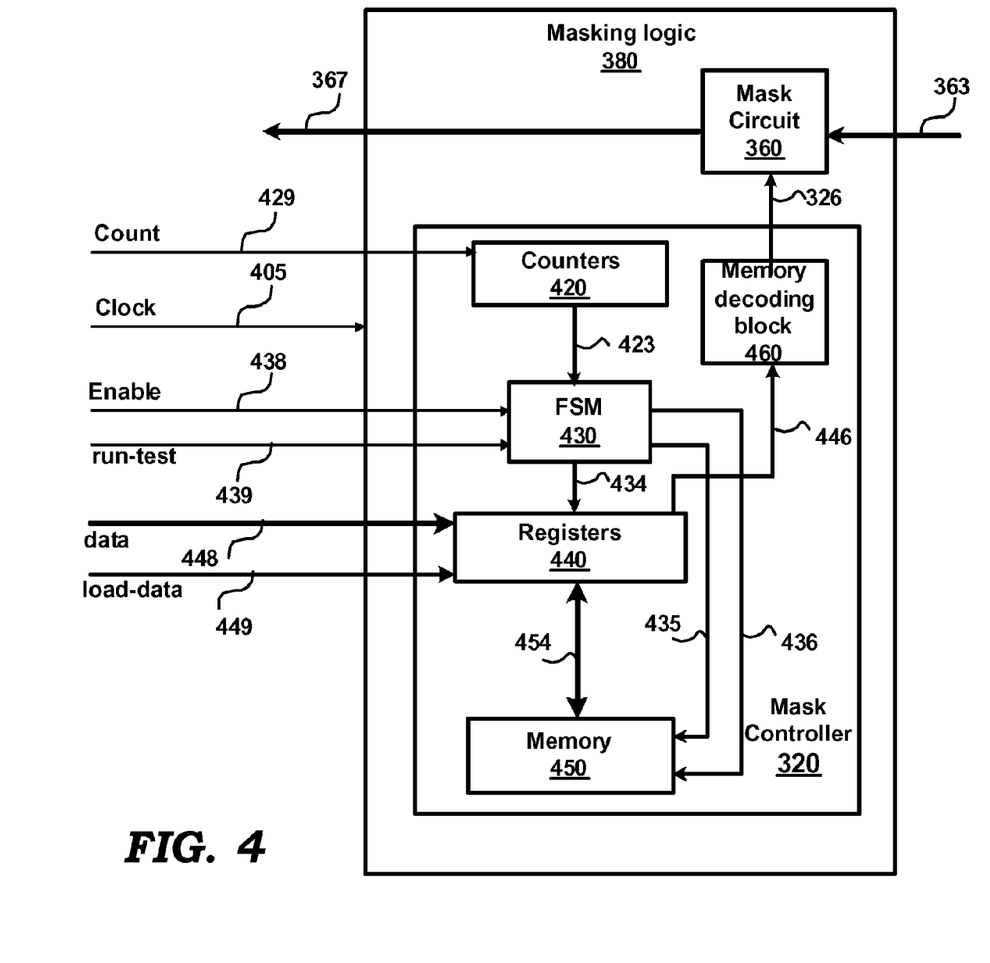
FIG. 4 is a block diagram depicting the details of the masking logic shown in FIG. 3 in one embodiment.

FIG. 4 is a block diagram depicting the details of masking logic 380 in one embodiment. The mask controller 320 portion of masking logic 380 is shown containing memory 450, registers 440, finite state machine (FSM) 430, Counters 420, and memory decoding block 460. Memory 450, registers 440, finite state machine (FSM) 430, Counters 420 and memory decoding block 460 are collectively referred to as mask controller 320 (also shown in FIG. 3). Each component is described in detail below.

Registers 440 receive data representing masking information on path 448 (contained in path 329), and forwards the received masking information to memory 450 (under control from FSM 430) on path 454 in response to a load-data signal (path 449, also contained in path 329).

During a scan test, registers 440 retrieves masking information (corresponding to each clock cycle) from memory 450 on path 454, and forwards the same to memory decoding block 460 on path 446 as specified by FSM 430. Registers 440 may contain multiple registers, and thus may store masking information corresponding to several clock cycles in advance, thus providing pipelining and speeding the retrieval of masking information.

During the loading of masking information from the tester to memory 450, registers 440 typically receives 16-bit data sequentially on path 449. Since memory 450 may be organized as a 32-bit memory, registers 440 may assemble two 16-bit data (pertaining to masking information) to generate a 32-bit data, which is forwarded to memory 450 in response to a control pulse from FSM 430 on path 443. During scan test operation, registers 450 receives a control pulse on path 434 from FSM 430 indicating when to start retrieving masking information from memory 450 for the next test cycle. In response to such a control pulse, registers 440 may flush (delete) all its contents to await reception of masking information from memory 450 for the next test cycle.

Counters 420 receives a count value from the tester on path 429. Registers inside counters 420 are loaded with the count value and the count is decremented every clock cycle. When a terminal count is reached (often a value zero), counters 420 provides a control pulse to FSM 430 on path 423 signifying an end of a test cycle.

FSM 430 provides address (on path 435) and control (on path 436) signals to memory 450 to store and retrieve masking information to and from memory 450. The provision of address and control signals is in synchronism with data transfer performed by registers 440.

FSM 430 receives an enable signal on path 438 from a tester (test shown) indicating that scan testing has been enabled.

FSM 430 receives a run-test signal from the tester on path 439 indicating that scan-out of a scan test be started, and in response generates address and control signals (paths 435 and 436) to enable mask information to be retrieved from memory 450.

FSM 430 effectively controls the retrieval of masking information from memory 450. In one embodiment, FSM 430 is designed to generate successive addresses (starting from address 0) for memory 450 till the address storing the masking information corresponding to the last clock cycle in a test cycle. Once the last clock cycle in a test cycle is reached, FSM 430 receives a control pulse on path 423 from counters 420.

In response to this control pulse, FSM 430 may reset the address on path 435 to zero, and starts the address generation operation again for the next test cycle. Consequently, in conjunction with registers 440, masking information is again retrieved from memory 450 starting from address 0. Thus the same set of masking information may be used for multiple test cycles, or alternatively tester 390 may load a new set of mask information as suitable for the next cycle.

It may be appreciated that the operation of counters 420, FSM 430 and registers 440 may be controlled to accommodate several options. For example, by sending a corresponding value of count on path 429 to counters 420, a desired number of masking information sets (words) may be retrieved from memory 450, before resetting the operation for a next test cycle. In other words, counters 420, FSM 430 and registers 440 may be designed to operate to facilitate a scan test cycle of a desired length (number of clock/scan cycles). Counters 420, FSM 430 and registers 440 may be implemented in a known way.

Operations of counters 420, FSM 430 and registers 440 are coordinated by a clock signal 405, and may occur with respect to a transition of clock signal 405. During loading (storing) of masking information from a tester, clock 450 may be provided by the tester, while during operation of the circuit of FIG. 4 during a scan, clock 450 may be provided either by the tester or by a clock signal from the circuit under test containing the scan chains.

Memory 450 stores masking information received from the tester via registers 440 on path 445 during a load operation, and forwards masking information to registers 440 on path 454 during a scan test. Memory 450 receives address and control signals from FSM 430 on paths 435 and 436 respectively. Memory 450 may be implemented as a random access memory (RAM) and implemented in a known way.

Memory decoding block 460 receives masking information from memory 450 (via) registers 440) and decodes the masking information to generate mask data to be applied to mask corresponding bits (conveniently referred to as a pre-masked vector) in a scan-out vector. Mask data thus generated is provided to mask circuit 360 on path 326. In one embodiment, memory decoding block 460 receives 32-bit wide masking information on path 446, and provides 256-bit wide mask data on path 326.

Mask circuit 360 operates similar to the manner described above, and the description is not repeated here for the sake of conciseness.

In a typical scan test scenario the number of scan chains that are tested simultaneously (parallelly) may be large. Consequently, the number of bits arriving simultaneously on path 363 may be large. For example, 256 scan chains may be tested during a scan test, and thus there are potentially 256 bits that may have to be masked during a scan cycle.

Memory devices typically have a word width of 32 or less. Thus, as an example, memory 450 may have to store masking information for 256 bits (corresponding to one clock cycle/ scan cycle) in a memory location that may be only 32 bits wide. In an embodiment of the present invention masking information for each scan cycle is compressed by an encoding operation to fit in a word in memory 450. Accordingly, the description is continued with a description of an example encoding scheme for mask data.

6. Mask Data Encoding

Figure 5:
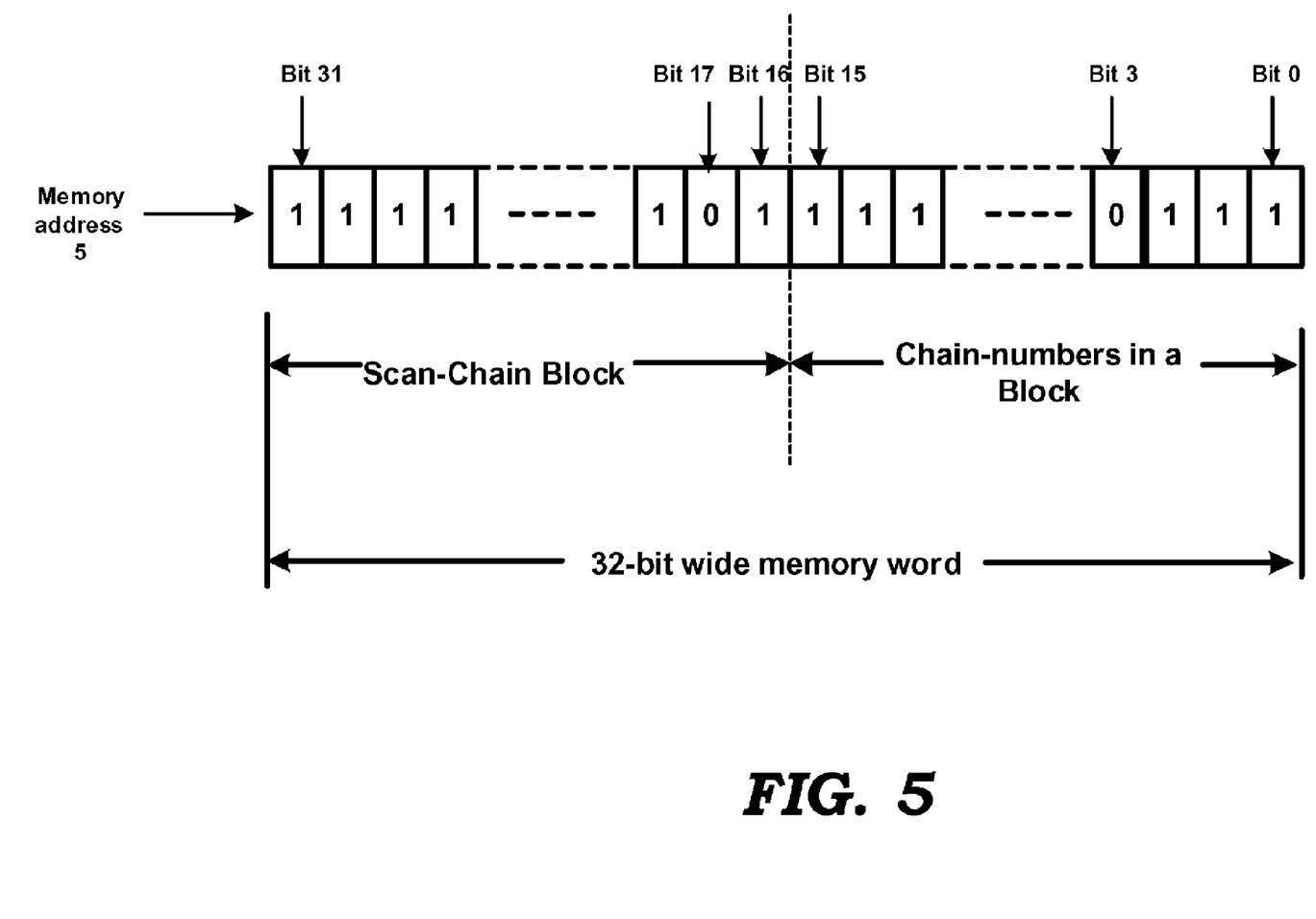
FIG. 5 is a diagram used to illustrate an example encoding scheme for mask data provided to mask scan-out vectors in a scan test.

FIG. 5 is a diagram showing the bits in a 32-bit wide memory word which may be used in memory 450 of FIG. 4. The diagram is used to illustrate an example encoding scheme for mask data provided to mask scan-out vectors in a scan test. It is assumed in the following description that there are 256 scan chains in the circuit under test.

The 32-bit memory word is shown numbered from bit 0 to bit 31. Bits 0 through 15 are used to specify which scan chain in a corresponding group of scan chains are to be masked, and bits 16 through 31 are used to specify which group of scan chains contain the individual scan chain(s) (specified by bits 0 to 15) that need to be masked. This is described further below.

The 256 scan chains may be conveniently grouped in sixteen groups, with each group containing sixteen scan chains. As seen in FIG. 5, bits 15 through 31 in the 32-bit wide memory word are used to specify which scan chain group contains a scan chain(s) specified in bits 0 to 15 that is (are) to be masked, and bits 0 through 15 are used to specify which scan chain in the corresponding group is to be masked.

As an example, if the output bit generated by scan chain 20 is to be masked at scan-out (clock) cycle 5, a corresponding value of binary 1111111111111101 1111111111110111 will be stored at memory address 5 (assuming masking information is stored starting from memory address 1). Scan chain 20 may be seen as belonging to group 2 in the sixteen groups of sixteen scan chains each. Consequently, the second bit (and hence bit 17 of the memory word) of the 16 bits representing each scan chain group is entered as a logic 0. Scan chain 20 may also be seen as being the fourth scan in the second group of scan chains, and consequently the entry corresponding to bit 3 of the memory word is made a logic 0.

The encoding approach of above may, however, cause more bits to be masked than desired. As an example, if scan chains 20 and 50 need to be masked during scan-out cycle 5, the above encoding approach provides a 32 bit value equal to binary 1111111111110101 1111111111111010 to be stored at memory address 5. As may be verified, this value causes the bit outputs of scan chains 18 and 52 to be masked in addition to the desired scan chains 20 and 50, during scan-out cycle 5. Such an undesirable effect is minimized in the described encoding scheme if the scan patterns are designed such that at most one scan chain from a group needs to be selected for masking (to the extent possible).

The indeterminate-state-masking technique described above may be used to prevent a signature analyzer from providing a corrupted (invalid) signature. However, it is desirable to ensure that the additional circuitry (shown in FIGS. 3 and 4) added to enable the masking feature itself does not cause an invalid bit value(s) to be provided to the signature analyzer. To this end, the following procedure may be used.

Memory 450 (FIG. 4) is loaded with bits all at logic 0. A scan test is performed for one or more test cycles, with the circuitry of FIG. 4 providing mask data (now containing a logic 0 at each bit position, and for all scan-out cycles). Thus, effectively, a predetermined set of scan-out vectors (containing logic 0 at all bit positions, and for each clock cycle) is provided to signature analyzer MISR 180 (FIG. 3). An expected signature may be calculated from computer simulations and compared with the output of MISR 180. If the signatures match it may be concluded that the masking circuitry is functioning correctly. The masking logic may also be tested by being included in a scan chain during a scan test.

7. Conclusion

While various embodiments of the present invention have been described above, it should be understood that they have been presented by way of example only, and not limitation. Thus, the breadth and scope of the present invention should not be limited by any of the above_described embodiments, but should be defined only in accordance with the following claims and their equivalents.

What is claimed is:

1. A method of testing an electronic circuit comprising a plurality of scan chains, wherein each of said plurality of scan chains contains a corresponding plurality of memory elements, said method comprising:

scanning-in a corresponding one of a plurality of scan in vectors to a respective one of a plurality of scan chains;

placing said integrated circuit in an evaluation mode to cause each of said plurality of scan chains to store a corresponding one of a plurality of scan out vectors;

forming a plurality of output vectors in a corresponding plurality of scan out cycles in which said scan out vectors are scanned out from said plurality of scan chains, wherein each bit of said plurality of output vectors is formed from either a bit from a corresponding one of said plurality of scan out vectors or a masked value in case said bit from said corresponding one of said plurality of scan out vectors corresponds to an indeterminate state; and processing said plurality of output vectors through a signature generator circuit which generates a signature corresponding to said plurality of output vectors, whereby indeterminate values are avoided in said processing.

2. The method of claim 1, further comprising compressing each of said output vectors and wherein said processing processes said plurality of output vectors in a compressed form.

3. The method of claim 1, said method further comprising:

generating data representing the bits of the specific ones of the plurality of scan out vectors which are to be masked for each scan out cycle in said forming.

4. The method of claim 3, wherein said generating comprises:

storing in a memory a plurality of entries, wherein each of said plurality of entries specifies a corresponding combination of scan out vectors which are to be masked in said forming; and retrieving from said memory data in one of said plurality of entries in each of said plurality of scan out cycles, wherein the retrieved data indicates the bit corresponding to the specific ones of the plurality of scan out vectors which are to be masked in said forming during the corresponding scan out cycle.

5. The method of claim 4, wherein said plurality of scan chains are logically divided into a plurality of groups, wherein each of said entries is divided into two portions, with each bit in one portion specifying whether the corresponding group is selected for masking and each bit in the other portion specifying which specific positions in all selected groups have to be masked.

6. The method of claim 5, wherein each of said plurality of entries corresponds to a corresponding one of a scan out cycle in one test cycle.

7. An electronic circuit comprising:
a plurality of scan chains into which respective ones of a plurality of scan-in vectors are scanned in, wherein said electronic circuit is placed in a evaluation mode after completing said scanning-in to cause each of said plurality of scan chains to store a corresponding one of a plurality of scan-out vectors, each of said plurality of scan chains providing a corresponding bit of a pre-masked vector in each of a plurality of scan cycles in a test cycle;
a masking logic forming a plurality of output vectors in a corresponding plurality of scan out cycles, wherein each bit of said plurality of output vectors is formed from either a corresponding bit of said pre-masked vector or a masked value in case said corresponding bit corresponds to an indeterminate state; and
a signature generator circuit processing said plurality of output vectors and generating a signature corresponding to said plurality of output vectors,
whereby indeterminate values are avoided by said signature generator circuit in said processing.

8. The electronic circuit of claim 7, further comprising a compressor compressing each of said output vectors and providing a compressed output to said signature generator.

9. The electronic circuit of claim 7, wherein said masking logic comprises a mask controller generating data representing the bits of the specific ones of the plurality of scan out vectors which are to be masked for each scan out cycle by said mask circuit.

10. The electronic circuit of claim 9, wherein said masking logic further comprises a mask circuit, said mask circuit comprises a plurality of AND gates, wherein each of said plurality of AND gates receives a bit of said pre-masked vector and a bit generated by said mask controller.

11. The electronic circuit of claim 10, wherein said mask controller comprises:
a memory storing a plurality of entries, wherein each of said plurality of entries specifies a corresponding combination of scan out vectors which are to be masked; and
a logic circuit retrieving from said memory data in one of said plurality of entries in each of said plurality of scan out cycles and providing the retrieved entry to said mask circuit, wherein the retrieved data indicates the specific bits of the corresponding pre-masked vector which are to be masked during the corresponding scan out cycle.

12. The electronic circuit of claim 11, wherein said plurality of scan chains are logically divided into a plurality of groups, wherein each of said entries is divided into two portions, with each bit in one portion specifying whether the corresponding group is selected for masking and each bit in the other portion specifying which specific positions in all selected groups have to be masked.

13. An electronic circuit comprising a plurality of scan chains, wherein each of said plurality of scan chains contains a corresponding plurality of memory elements, said electronic circuit comprising:
means for scanning-in a corresponding one of a plurality of scan in vectors to a respective one of a plurality of scan chains;
means for placing said integrated circuit in an evaluation mode to cause each of said plurality of scan chains to store a corresponding one of a plurality of scan out vectors;
means for forming a plurality of output vectors in a corresponding plurality of scan out cycles in which said scan out vectors are scanned out from said plurality of scan chains, wherein each bit of said plurality of output vectors is formed from either a bit from a corresponding one of said plurality of scan out vectors or a masked value in case said bit from said corresponding one of said plurality of scan out vectors corresponds to an indeterminate state; and
means for processing said plurality of output vectors through a signature generator circuit which generates a signature corresponding to said plurality of output vectors,
whereby indeterminate values are avoided as inputs to said means for processing.

14. The electronic circuit of claim 13, further comprising means for compressing each of said output vectors and said means for processing processes said plurality of output vectors in a compressed form.

15. The electronic circuit of claim 13, further comprising:
means for generating data representing the bits of the specific ones of the plurality of scan out vectors which are to be masked for each scan out cycle in said forming.

16. The electronic circuit of claim 15, wherein said means for generating stores in a memory a plurality of entries, wherein each of said plurality of entries specifies a corresponding combination of scan out vectors which are to be masked in said forming; and
retrieves from said memory data in one of said plurality of entries in each of said plurality of scan out cycles, wherein the retrieved data indicates the bit corresponding to the specific ones of the plurality of scan out vectors which are to be masked in said forming during the corresponding scan out cycle.

17. The electronic circuit of claim 16, wherein said plurality of scan chains are logically divided into a plurality of groups, wherein each of said entries is divided into two portions, with each bit in one portion specifying whether the corresponding group is selected for masking and each bit in the other portion specifying which specific positions in all selected groups have to be masked.

* * * * *